United States Patent
Zhuang et al.

(10) Patent No.: US 9,520,887 B1
(45) Date of Patent: Dec. 13, 2016

(54) GLITCH FREE BANDWIDTH-SWITCHING SCHEME FOR AN ANALOG PHASE-LOCKED LOOP (PLL)

(71) Applicant: QUALCOMM Incorporated, San Diego, CA (US)

(72) Inventors: Jingcheng Zhuang, San Diego, CA (US); Jong Min Park, San Diego, CA (US); Lai Kan Leung, San Marcos, CA (US); Yiwu Tang, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 15/060,198

(22) Filed: Mar. 3, 2016

Related U.S. Application Data

(60) Provisional application No. 62/233,073, filed on Sep. 25, 2015.

(51) Int. Cl.
| | | |
|---|---|---|
| *H03L 7/06* | (2006.01) | |
| *H03L 7/10* | (2006.01) | |
| *H03L 7/089* | (2006.01) | |
| *H03L 7/093* | (2006.01) | |

(52) U.S. Cl.
CPC .............. *H03L 7/10* (2013.01); *H03L 7/0891* (2013.01); *H03L 7/093* (2013.01)

(58) Field of Classification Search
USPC .................................. 327/147–149, 156–158
See application file for complete search history.

(56) References Cited

U.S. PATENT DOCUMENTS

| | | | |
|---|---|---|---|
| 6,906,565 B2 | 6/2005 | Keaveney | |
| 6,940,356 B2 | 9/2005 | McDonald et al. | |
| 8,179,174 B2 | 5/2012 | Bunch | |
| 8,854,095 B2 * | 10/2014 | Katyal | H03L 7/0891 |
| | | | 327/156 |
| 2003/0214330 A1 | 11/2003 | Tanigashira et al. | |
| 2009/0237131 A1 * | 9/2009 | Shin | H03L 7/0893 |
| | | | 327/157 |
| 2011/0050301 A1 * | 3/2011 | Perrott | H03H 19/008 |
| | | | 327/156 |

(Continued)

OTHER PUBLICATIONS

Cheng S., et al., "Design and Analysis of an Ultrahigh-Speed Glitch-Free Fully Differential Charge Pump With Minimum Output Current Variation and Accurate Matching," IEEE Transactions on Circuits and Systems—II: Express Briefs, Sep. 2006, vol. 53 (9), pp. 843-847.

*Primary Examiner* — Adam Houston
(74) *Attorney, Agent, or Firm* — Patterson & Sheridan, L.L.P.

(57) ABSTRACT

Certain aspects of the present disclosure provide techniques and apparatus for glitch-free bandwidth switching in a phase-locked loop (PLL). One example PLL generally includes a voltage-controlled oscillator (VCO) comprising a first variable capacitive element and a second variable capacitive element and a bandwidth adjustment circuit comprising a first switch in parallel with a resistor of a resistor-capacitor (RC) network. The bandwidth adjustment circuit is configured to open the first switch for a first bandwidth mode, close the first switch in a transition from the first bandwidth mode to a second bandwidth mode, and control a capacitance of the second variable capacitive element based on a voltage of a node of the RC network.

30 Claims, 7 Drawing Sheets

(56) References Cited

U.S. PATENT DOCUMENTS

| | | | |
|---|---|---|---|
| 2012/0025882 A1* | 2/2012 | Shanan | H03L 7/0893 327/157 |
| 2012/0049913 A1* | 3/2012 | Tadjpour | H03L 7/104 327/157 |
| 2013/0049711 A1* | 2/2013 | Mirea | H02M 3/1563 323/234 |
| 2014/0162573 A1* | 6/2014 | Laskar | H04B 1/403 455/73 |
| 2014/0241335 A1* | 8/2014 | Chen | H03L 7/093 370/342 |
| 2015/0162922 A1* | 6/2015 | Song | H04L 7/0091 375/376 |
| 2016/0020775 A1* | 1/2016 | Kuo | H03L 7/093 327/159 |

\* cited by examiner

GLITCH FREE BANDWIDTH-SWITCHING SCHEME FOR AN ANALOG PHASE-LOCKED LOOP (PLL)

CLAIM OF PRIORITY UNDER 35 U.S.C. §119

The present application claims benefit of U.S. Provisional Patent Application Ser. No. 62/233,073, entitled "GLITCH-FREE BANDWIDTH SWITCHING SCHEME FOR AN ANALOG PHASE-LOCKED LOOP (PLL)" and filed Sep. 25, 2015, which is assigned to the assignee of the present application and hereby expressly incorporated by reference herein in its entirety.

TECHNICAL FIELD

Certain aspects of the present disclosure generally relate to electronic circuits and, more particularly, to a phase-locked loop (PLL) capable of changing its loop bandwidth.

BACKGROUND

Wireless communication networks are widely deployed to provide various communication services such as telephony, video, data, messaging, broadcasts, and so on. Such networks, which are usually multiple access networks, support communications for multiple users by sharing the available network resources. For example, one network may be a 3G (the third generation of mobile phone standards and technology) system, which may provide network service via any one of various 3G radio access technologies (RATs) including EVDO (Evolution-Data Optimized), 1×RTT (1 times Radio Transmission Technology, or simply 1×), W-CDMA (Wideband Code Division Multiple Access), UMTS-TDD (Universal Mobile Telecommunications System-Time Division Duplexing), HSPA (High Speed Packet Access), GPRS (General Packet Radio Service), or EDGE (Enhanced Data rates for Global Evolution). The 3G network is a wide area cellular telephone network that evolved to incorporate high-speed internet access and video telephony, in addition to voice calls. Furthermore, a 3G network may be more established and provide larger coverage areas than other network systems. Such multiple access networks may also include code division multiple access (CDMA) systems, time division multiple access (TDMA) systems, frequency division multiple access (FDMA) systems, orthogonal frequency division multiple access (OFDMA) systems, single-carrier FDMA (SC-FDMA) networks, 3rd Generation Partnership Project (3GPP) Long Term Evolution (LTE) networks, and Long Term Evolution Advanced (LTE-A) networks.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station.

SUMMARY

Certain aspects of the present disclosure generally relate to a glitch-free bandwidth-switching scheme for a phase-locked loop (PLL).

Certain aspects of the present disclosure provide a PLL. The PLL generally includes a voltage-controlled oscillator (VCO) comprising a first variable capacitive element and a second variable capacitive element; and a bandwidth (BW) adjustment circuit comprising a first switch in parallel with a resistor of a resistor-capacitor (RC) network. The BW adjustment circuit is configured to open the first switch for a first bandwidth mode; to close the first switch in a transition from the first bandwidth mode to a second bandwidth mode; and to control a capacitance of the second variable capacitive element based on a voltage of a node of the RC network.

According to certain aspects, the voltage of the node is based at least in part on a voltage at the resistor of the RC network when the first switch is open and on a voltage at a capacitor of the RC network when the first switch is closed.

According to certain aspects, the BW adjustment circuit further includes a resistor in series with the RC network and a second switch in parallel with the resistor in series, wherein a resistance in series with the RC network is higher when the second switch is closed. For certain aspects, the resistor in series is configured to prevent the voltage of the node of the RC network from changing substantially in the transition from the first bandwidth mode to the second bandwidth mode.

According to certain aspects, the BW adjustment circuit further includes an amplification stage, and a gain associated with the second variable capacitive element is based on a gain of the amplification stage. For certain aspects, the PLL further includes a charge pump. In this case, a capacitance of the first variable capacitive element may be controlled based on an output of the charge pump, and the amplification stage may be coupled between the output of the charge pump and the RC network. For certain aspects, the amplification stage includes an amplifier, a first resistor, and a second resistor; the output of the charge pump is coupled to a first input of the amplifier; a second input of the amplifier is coupled to a node between the first resistor and the second resistor; the first resistor is coupled to an output of the amplifier; the second resistor is coupled to a reference potential; and the gain of the amplification stage is set by controlling a resistance of at least one of the first resistor or the second resistor.

According to certain aspects, a gain associated with the first variable capacitive element is less than a gain associated with the second variable capacitive element.

According to certain aspects, the PLL further includes a loop filter, wherein a resistance of the loop filter is changed between the first bandwidth mode and the second bandwidth mode. For certain aspects, the loop filter includes a first resistor, a capacitor, and a second resistor in series with a second switch; the first resistor is connected in series with the capacitor; the second resistor and the second switch are connected in parallel with the first resistor; and the second switch is closed for the first bandwidth mode and opened for the second bandwidth mode.

According to certain aspects, the BW adjustment circuit is configured to transition from the first bandwidth mode to the second bandwidth mode after the PLL is frequency locked.

According to certain aspects, the first variable capacitive element is connected in parallel with the second variable capacitive element.

Certain aspects of the present disclosure provide a method for adjusting a bandwidth of a PLL. The method generally includes controlling a capacitance of a first variable capacitive element of a VCO of the PLL; controlling a capacitance of a second variable capacitive element of the VCO based on a voltage of a node of an RC network comprising a resistor in parallel with a first switch; opening the first switch for a first bandwidth mode; and closing the first switch in a transition from the first bandwidth mode to a second bandwidth mode.

Certain aspects of the present disclosure provide an apparatus for adjusting a BW of a feedback loop for a PLL. The apparatus generally includes means for generating an oscillating signal comprising a first variable capacitor and a second variable capacitor; means for charging and discharging one or more capacitors based on the feedback loop to generate a first control signal, wherein the first control signal is configured to control a capacitance of the first variable capacitor; and means for adjusting the BW of the feedback loop by generating a second control signal to control a capacitance of the second variable capacitor, wherein the means for adjusting the BW is configured to: change a resistance of a resistor-capacitor (RC) network configured to process the second control signal; and to alter a series resistance between the RC network and an output of the means for charging and discharging the one or more capacitors.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Figure 1:
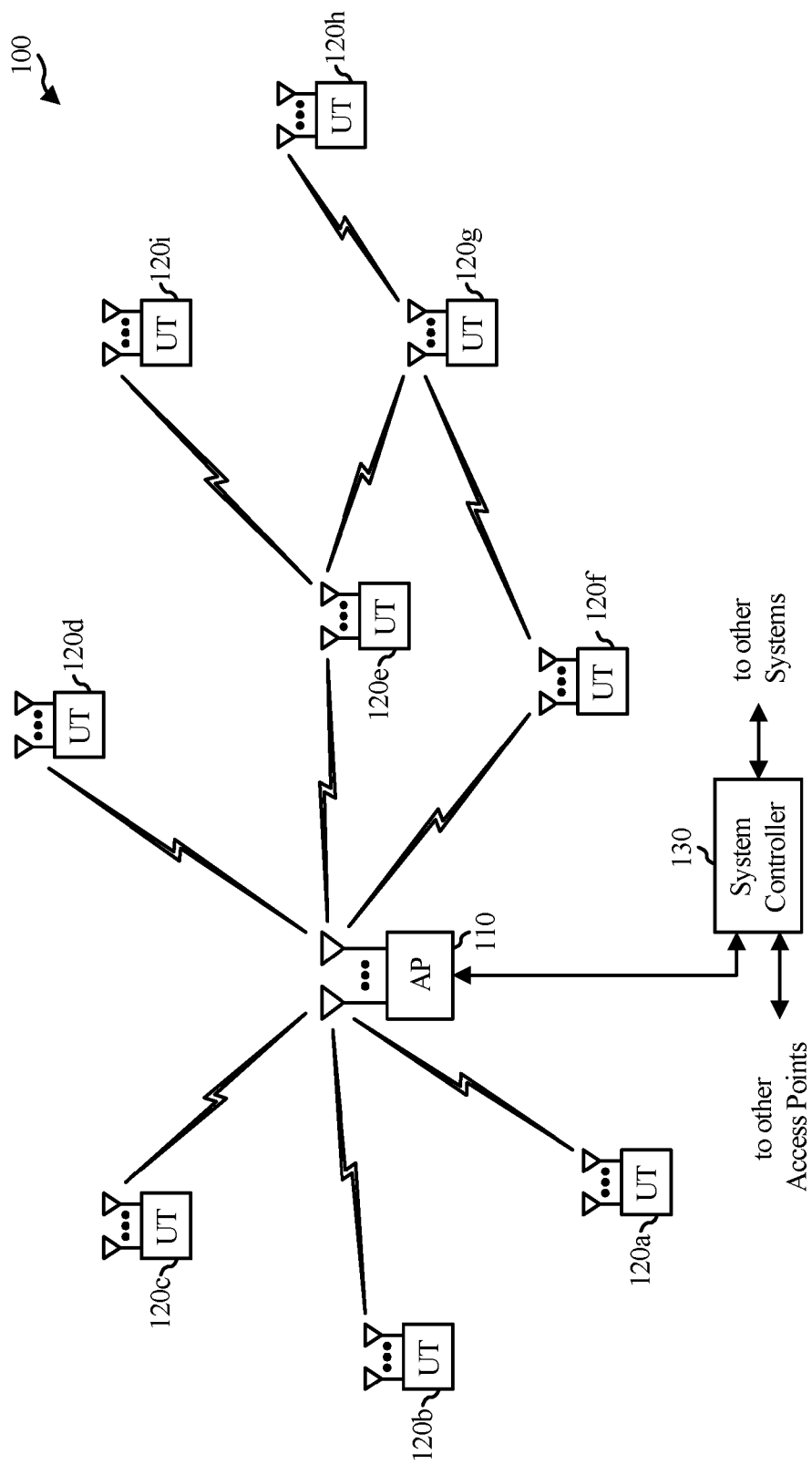
FIG. 1 is a diagram of an example wireless communications network, in accordance with certain aspects of the present disclosure.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

The techniques described herein may be used in combination with various wireless technologies such as Code Division Multiple Access (CDMA), Orthogonal Frequency Division Multiplexing (OFDM), Time Division Multiple Access (TDMA), Spatial Division Multiple Access (SDMA), Single Carrier Frequency Division Multiple Access (SC-FDMA), Time Division Synchronous Code Division Multiple Access (TD-SCDMA), and so on. Multiple user terminals can concurrently transmit/receive data via different (1) orthogonal code channels for CDMA, (2) time slots for TDMA, or (3) sub-bands for OFDM. A CDMA system may implement IS-2000, IS-95, IS-856, Wideband-CDMA (W-CDMA), or some other standards. An OFDM system may implement Institute of Electrical and Electronics Engineers (IEEE) 802.11, IEEE 802.16, Long Term Evolution (LTE) (e.g., in TDD and/or FDD modes), or some other standards. A TDMA system may implement Global System for Mobile Communications (GSM) or some other standards. These various standards are known in the art.

An Example Wireless System

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

System 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless system 100 may be a time division duplex (TDD) system or a frequency division duplex (FDD) system. For a TDD system, the downlink and uplink share the same frequency band. For an FDD system, the downlink and uplink use different frequency bands. System 100 may also utilize a single carrier or multiple carriers for transmission. Each user terminal 120 may be equipped with a single antenna (e.g., in order to keep costs down) or multiple antennas (e.g., where the additional cost can be supported).

The access point 110 and/or user terminal 120 may include one or more frequency synthesizers to generate periodic signals used for signal transmission and/or reception. At least one of the frequency synthesizers may include a phase-locked loop (PLL) having a bandwidth adjustment circuit, as described below.

Figure 2:
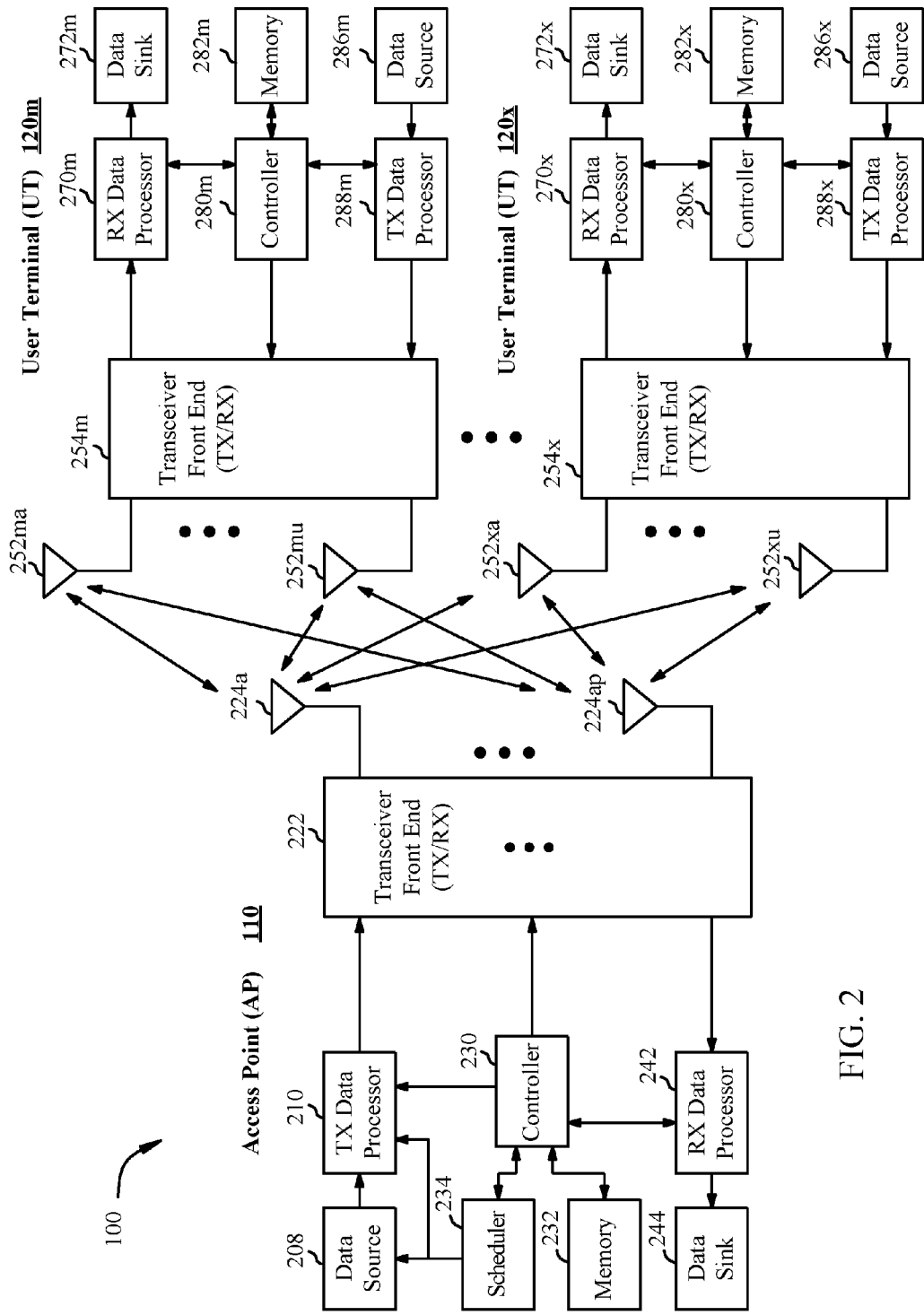
FIG. 2 is a block diagram of an example access point (AP) and example user terminals, in accordance with certain aspects of the present disclosure.

FIG. 2 shows a block diagram of access point 110 and two user terminals 120m and 120x in wireless system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via an RF switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing.

The transceiver front end (TX/RX) 222 of access point 110 and/or transceiver front end 254 of user terminal 120 may include one or more frequency synthesizers to generate periodic signals used for signal transmission and/or reception. At least one of the frequency synthesizers may include a phase-locked loop (PLL) having a bandwidth adjustment circuit, as described below.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

Those skilled in the art will recognize the techniques described herein may be generally applied in systems utilizing any type of multiple access schemes, such as TDMA, SDMA, Orthogonal Frequency Division Multiple Access (OFDMA), CDMA, SC-FDMA, TD-SCDMA, and combinations thereof.

Figure 3:
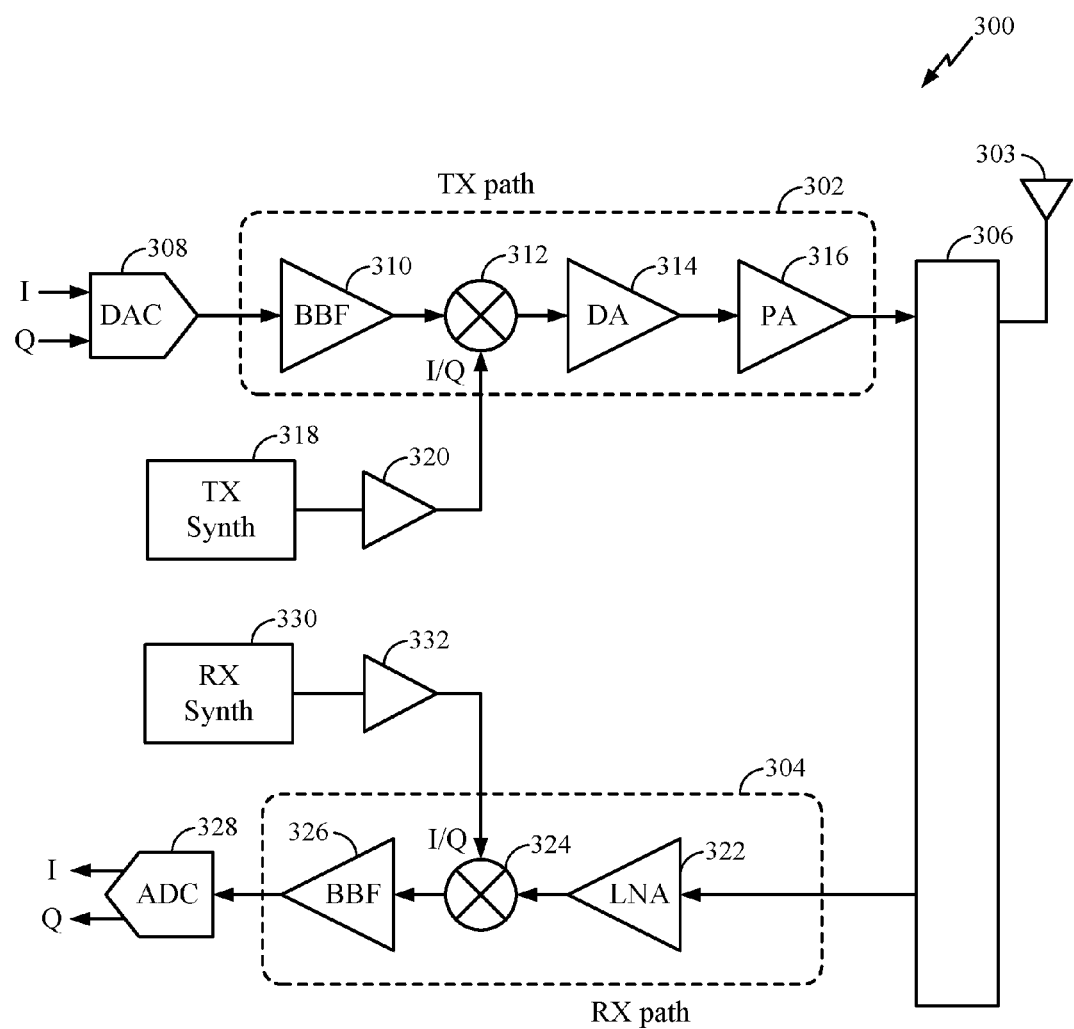
FIG. 3 is a block diagram of an example transceiver front end, in accordance with certain aspects of the present disclosure.

FIG. 3 is a block diagram of an example transceiver front end 300, such as transceiver front ends 222, 254 in FIG. 2, in which aspects of the present disclosure may be practiced. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC), while the PA 316 may be external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which may be amplified by the DA 314 and/or by the PA 316 before transmission by the antenna 303.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO to remain stable in frequency, tuning to different frequencies indicates using a variable-frequency oscillator, which involves compromises between stability and tunability. Contemporary systems may employ frequency synthesizers with a voltage-controlled oscillator (VCO) to generate a stable, tunable LO with a particular tuning range. Thus, the transmit LO frequency may be produced by a TX frequency synthesizer 318, which may be buffered or amplified by amplifier 320 before being mixed with the baseband signals in the mixer 312. Similarly, the receive LO frequency may be produced by an RX frequency synthesizer 330, which may be buffered or amplified by amplifier 332 before being mixed with the RF signals in the mixer 324.

In some aspects of the present disclosure, the VCO of the frequency synthesizer may be implemented as a part of a phase-locked loop (PLL) circuit. The TX frequency synthesizer 318 and/or RX frequency synthesizer 330 may include a PLL having a bandwidth adjustment circuit, as described below.

Example Phase-Locked Loop (PLL)

Figure 4:
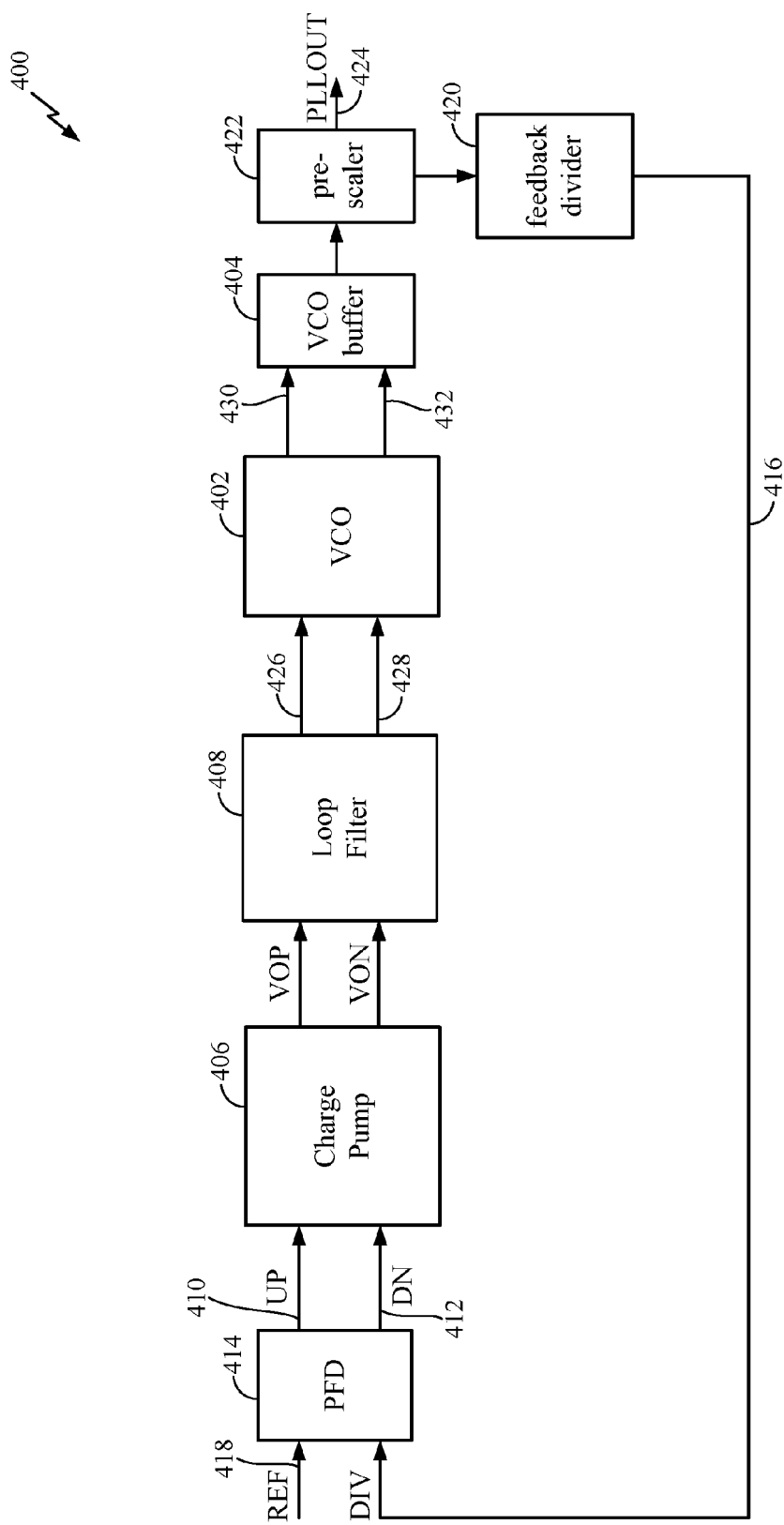
FIG. 4 is a block diagram of an example phase-locked loop (PLL), in accordance with certain aspects of the present disclosure.

FIG. 4 is a block diagram of an example PLL 400 comprising a VCO 402 interfaced with a VCO buffer 404, in accordance with certain aspects of the present disclosure. The PLL 400 may be utilized in a frequency synthesizer, such as the TX frequency synthesizer 318 or the RX frequency synthesizer 330 of FIG. 3.

As illustrated in FIG. 4, a charge pump 406 coupled to a low-pass loop filter 408 (also referred to as a charge pump filter or PLL loop filter) may provide a control voltage to the VCO 402 that determines an oscillation frequency of the VCO 402. The charge pump 406 and the VCO 402 may receive power via two power supply rails: a positive supply rail and a negative supply rail. Switches in the charge pump 406 may be controlled by up/down pulse signals 410, 412 (labeled "UP" and "DN"), and the loop filter 408 may reject the high frequency transient signals from this switching activity. These up/down pulse signals 410, 412 may be generated by a phase-frequency detector (PFD) 414, which may compare a feedback signal 416 (based on an output or processed output of the VCO 402 and labeled "DIV") to a reference frequency signal 418 (labeled "REF"). In an aspect, as illustrated in FIG. 4, the feedback signal 416 may be generated by buffering the output of the VCO 402 with the VCO buffer 404, scaling the buffered signal in a pre-scaler 422 to generate the PLL's output signal 424 (labeled "PLLOUT"), and dividing an output of the pre-scaler 422 in a feedback divider 420.

In some aspects of the present disclosure, as illustrated in FIG. 4, the input control voltage for the VCO 402 may be provided by the charge pump 406 and the low-pass loop filter 408 via VCO control inputs 426, 428. A resonant tank circuit of the VCO 402 may generate, at differential VCO outputs 430, 432, a periodic signal having a specific frequency (e.g., determined by a voltage at the VCO control inputs 426, 428), which may be input to the VCO buffer 404. The VCO buffer 404 may be coupled to the differential VCO outputs 430, 432 in an effort to isolate the VCO 402 from the load in the PLL 400 and other circuits receiving the PLL's output signal 424. The VCO buffer 404 may be also employed in an effort to amplify the signal swing and correct any duty cycle distortions of the differential VCO outputs 430, 432.

Example Bandwidth-Switching Scheme for a PLL

As presented above, the charge pump 406 charges and discharges a loop filter capacitor based on a feedback signal generated using the VCO outputs 430, 432. That is, the charging and discharging cycles of the charge pump 406 adjust a tuning voltage (e.g., control input signals 426 and 428 input to the VCO 402) based on the feedback signal 416 in an effort to lock a phase/frequency of the VCO to a desired phase/frequency during an initial locking phase of the PLL. In order to more rapidly lock onto the desired phase/frequency, a feedback loop bandwidth (BW) of the PLL 400 may be increased. With a higher feedback loop BW, the charge pump can more quickly adjust the frequency of the VCO in response to the feedback signal 416, thus, resulting in faster PLL phase/frequency lock. However, such a higher feedback loop BW may adversely affect the accuracy at which a frequency may be tracked by the PLL. Thus, it may be desirable to initially increase the feedback loop BW of the PLL, but subsequently switch to a nominal loop BW for more accuracy once phase/frequency locking is achieved. However, switching the loop BW in this manner may result in significant frequency and/or phase glitches, which may be sufficient to cause the PLL to lose phase/frequency lock. Accordingly, what is needed are techniques and apparatus for glitch-free (or at least reduced) loop BW switching for a PLL.

Figure 5A:
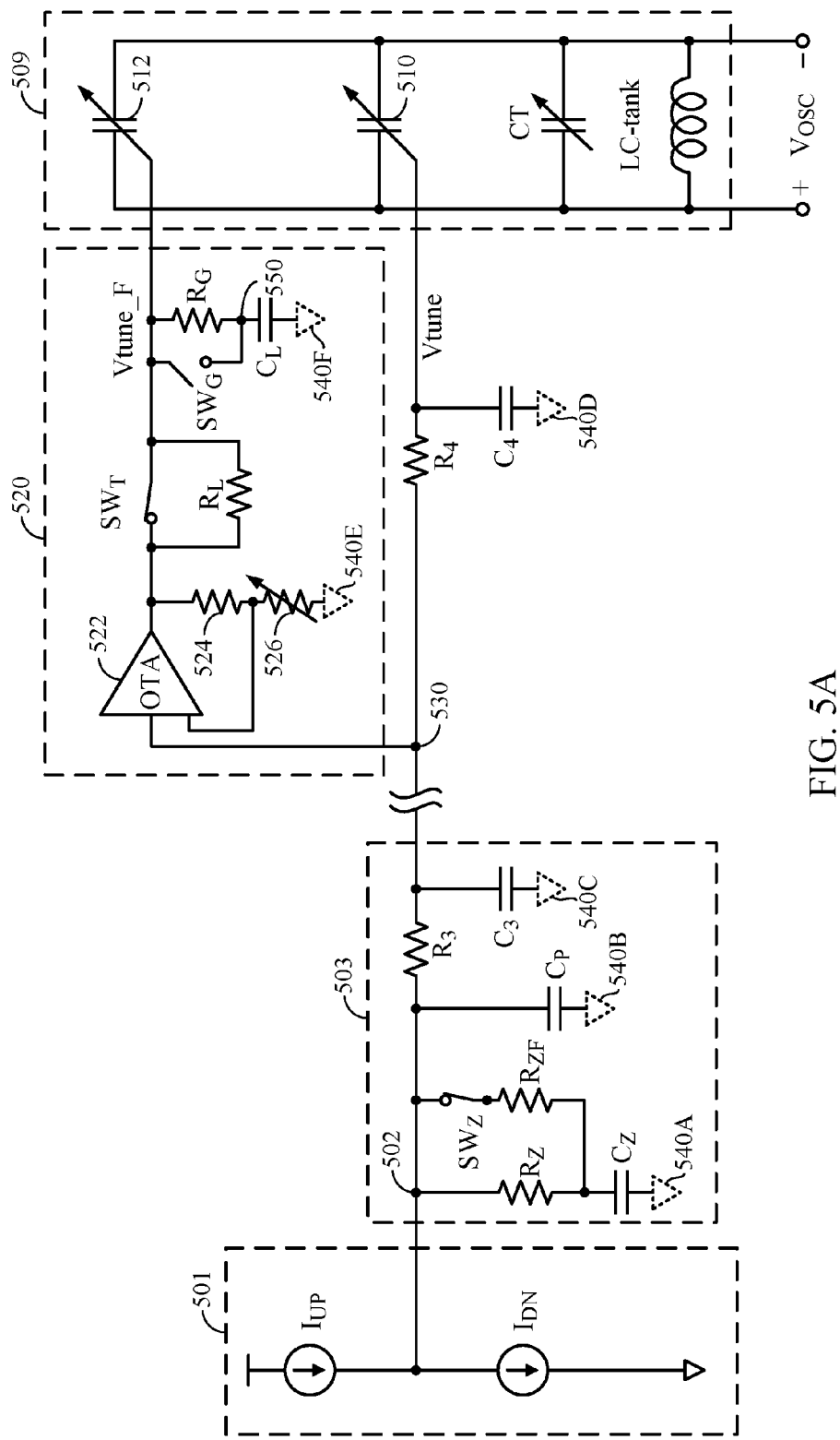
FIG. 5A is a schematic diagram of an example bandwidth (BW) adjustment circuit of a PLL, with the switches in a higher loop bandwidth mode, in accordance with certain aspects of the present disclosure.

FIG. 5A illustrates example circuitry used for BW switching in a PLL, according to certain aspects of the present disclosure. As illustrated, a charge pump 501 (shown here as a single-ended implementation of charge pump 406) includes a current source $I_{UP}$ and a current source $I_{DN}$ that represent respective charging and discharging currents to the capacitors $C_Z$ and $C_P$ of a charge pump loop filter 503 (also referred to as a PLL loop filter). As illustrated, the loop filter 503 is coupled to the charge pump 501 and to a tuning voltage node (labeled "Vtune") of a VCO 509 via a trace. Resistor $R_3$ and capacitor $C_3$ may be part of the loop filter 503. In certain aspects, resistors $R_4$ and capacitor $C_4$ may also be part of the loop filter 503. Vtune may be used to adjust a variable capacitor 510 of the VCO 509, which in turn adjusts the frequency of the oscillating signal ($V_{OSC}$) generated by the VCO 509. In certain aspects, the contribution to the VCO gain ($K_{VCO}$) by the variable capacitor 510 may be 20 MHz/V, for example.

Figure 5B:
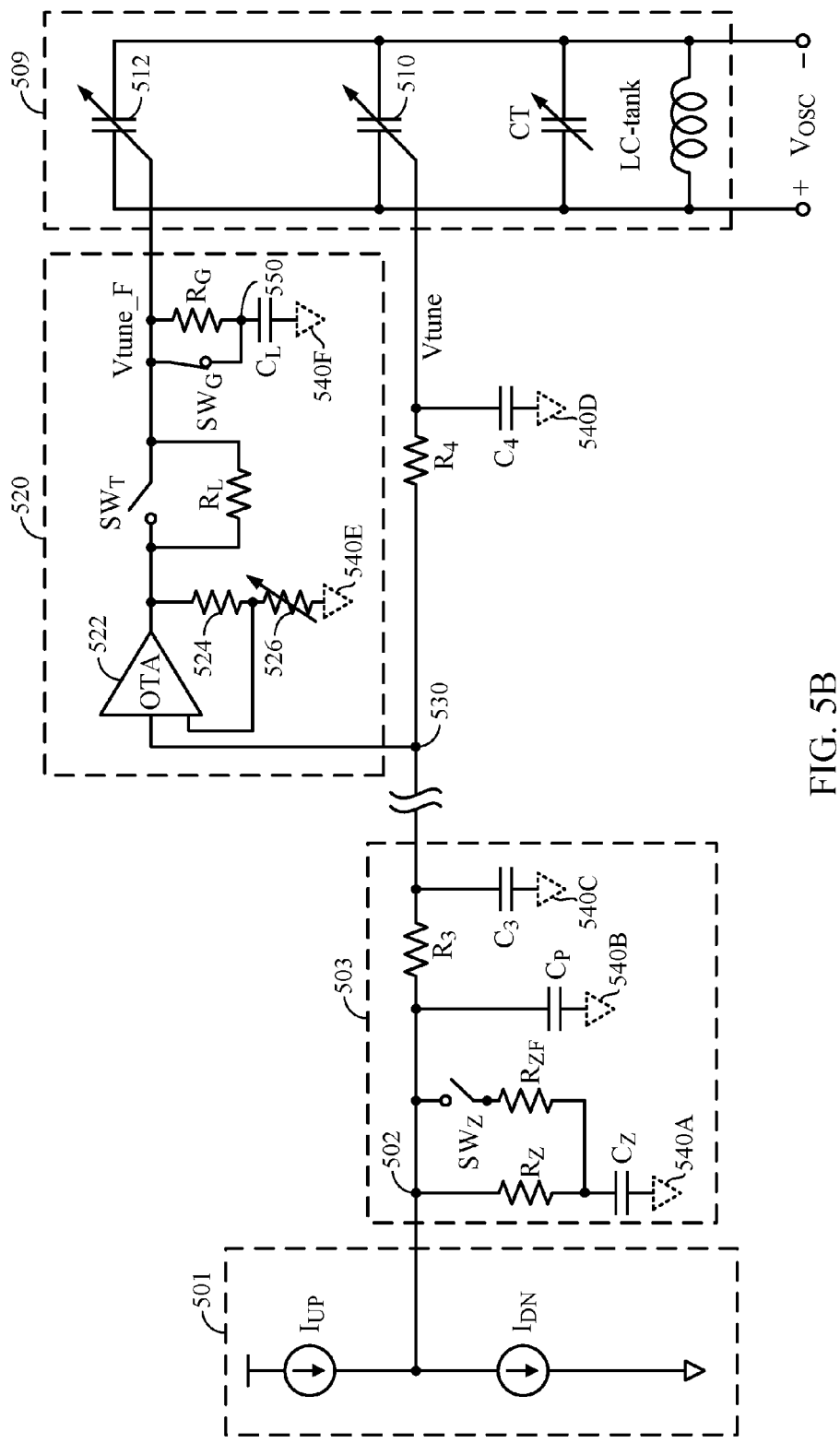
FIG. 5B is a schematic diagram of the BW adjustment circuit of FIG. 5A, with the switches in a lower loop bandwidth mode, in accordance with certain aspects of the present disclosure.

The charging speed of capacitor $C_Z$ of the loop filter 503 may impact how quickly the charge pump 501 can change the voltage of Vtune. The charging speed of capacitor $C_Z$ is a function of the loop filter components including filter resistor $R_Z$. Thus, the charging speed of capacitor $C_Z$ may be adjusted by changing the value of the resistance in series with capacitor $C_Z$, such that capacitor $C_Z$ charges more slowly or more quickly. As an example implementation of this, a resistor $R_{ZF}$ may be selectively connected in parallel with resistor $R_Z$ via a switch $SW_Z$ as shown in FIG. 5A. That is, by closing the switch $SW_Z$, the equivalent resistance between $C_Z$ and node 502 may be decreased from $R_Z$ to $R_Z \| R_{ZF}$, which in turn increases the charging speed of capacitor $C_Z$. Accordingly, during an initial locking phase of the PLL as shown in FIG. 5A, switch $S_{WZ}$ may be closed to increase the charging speed of capacitor $C_Z$ and subsequently opened for stability, as depicted in FIG. 5B, once phase/frequency locking of the PLL has been achieved.

In certain aspects of the present disclosure, the VCO 509 may include another variable capacitor 512, the capacitance of which may be adjusted via a BW adjustment circuit 520. That is, the BW adjustment circuit 520 may be configured to generate another tuning voltage (at node labeled "Vtune_F") used as a control input to the variable capacitor 512. In certain aspects, the variable capacitor 512 may have a higher contribution to the VCO gain ($K_{VCO}$) than variable capacitor 510. For example, the contribution to the $K_{VCO}$ by variable capacitor 512 may be 40 MHz/V, as compared to 20 MHz/V by variable capacitor 510. By including a second variable capacitor 512, a loop BW of the PLL may be increased during a high-bandwidth mode of operation.

In certain aspects, the BW adjustment circuit 520 may include an amplifier 522 (e.g., an operational transconductance amplifier (OTA)). The amplifier 522 may have external components (e.g., resistors 524, 526) arranged to implement a non-inverting amplification stage, as shown. Either or both resistors 524, 526 may be variable resistors. For example, resistor 526 may be a variable resistor, the resistance of which may be adjusted (e.g., via a control signal output by a controller, such as the controller 230 or 280 of FIG. 2) in order to adjust the gain of the non-inverting amplification stage. The loop BW of the PLL may be affected by a gain of the amplification stage with the amplifier 522.

The BW adjustment circuit 520 also includes an RC network comprising resistor $R_G$ and capacitor $C_L$. A resistor $R_L$ may be coupled between the output of the amplifier 522 and the RC network. According to certain aspects, during an initial fast locking phase (a higher/first loop bandwidth mode) of the PLL as illustrated in FIG. 5A, switch $SW_T$ (in parallel with resistor $R_L$) may be closed, thereby shorting the resistor $R_L$. In addition, switch $SW_G$ may be open such that the amplification stage drives the Vtune_F node loaded by the RC network.

After an initial fast locking period, the BW adjustment circuit 520 may transition to a lower/second loop bandwidth mode of operation, as illustrated in FIG. 5B. In the lower bandwidth mode, switch $SW_G$ may be closed, thereby shorting resistor $R_G$. Furthermore, switch $SW_T$ may be opened, placing resistor $R_L$ in series between the output of the amplifier 522 and the Vtune_F node. For certain aspects, switch $SW_T$ may be opened before switch $SW_G$ is closed.

In the configuration shown in FIG. 5B, the control input Vtune_F of the variable capacitor 512 effectively no longer changes based on any voltage change at node 530 because capacitor $C_L$ is coupled directly to Vtune_F and resistor $R_L$ (e.g., a relatively large resistor) may limit charging current from the amplifier 522 to the capacitor $C_L$. In other words, resistor $R_L$ may be a relatively large resistor used to increase the series resistance between the output of the amplifier 522 and Vtune_F such that the voltage of Vtune_F no longer follows any change in voltage at node 530. Thus, by increasing the series resistance between the output of the amplifier 522 and Vtune_F, capacitor 512 no longer impacts the $K_{VCO}$, and thus, the BW of the PLL may be reduced. As example values, the resistor $R_L$ may have a resistance of about 200 kΩ, the resistor $R_G$ may have a resistance of about 1 to 10 kΩ, and the capacitor $C_L$ may have a capacitance of about 50 pF.

With the BW adjustment circuit 520, glitches (i.e., high-frequency transients) of the Vtune_F signal can be reduced and prevented from affecting the capacitance of variable capacitor 512. These glitches in Vtune_F may be caused, for example, by operation of a delta-sigma modulator, which may be present in one or more converters (e.g., ADC 328) of an RF front end (e.g., transceiver front end 300). The effect of delta-sigma modulation on the voltage of the Vtune_F node may appear similar to dithering of this tuning voltage between different levels. While this changing tuning voltage may be acceptable during the initial locking phase of the PLL, a more constant voltage may most likely be desired during the lower loop bandwidth mode.

Thus, certain aspects of the present disclosure include the RC network (including resistor $R_G$ and capacitor $C_L$) to provide a filtered voltage of Vtune_F at a node 550 between the resistor $R_G$ and capacitor $C_L$. For example, during the higher bandwidth mode, switch $SW_G$ (in parallel with resistor $R_G$) may be open as discussed above. Therefore, the voltage at node 550 may represent an average (e.g., filtered) voltage of the Vtune_F signal. When switch $SW_T$ is opened (e.g., to decrease PLL loop bandwidth), switch $SW_G$ may be closed (e.g., after a small delay for certain aspects). By closing switch $SW_G$, the voltage of Vtune_F may be forced to the filtered voltage at node 550. Furthermore, by opening switch $SW_T$, the Vtune_F node is no longer directly connected to the output of the amplification stage, such that the voltage of the Vtune_F node can be different from the amplifier's output voltage. As a result, the capacitance of variable capacitor 512 may remain constant due to the constant value of control signal Vtune_F, which is forced to the average value at node 550 by the closing of switch $SW_G$. As Vtune_F remains constant, capacitor 512 no longer impacts the $K_{VCO}$ and thus, the loop bandwidth is decreased and remains constant (e.g., the PLL does not lose lock).

In certain aspects, values for $R_G$ and $C_L$ may be selected such that the BW of the RC network ($R_G$ and $C_L$) during the initial fast locking period is about one fifth of the PLL loop BW, per the following equation:

$$\frac{1}{R_G C_L}$$

In this configuration, the $K_{VCO}$ of VCO 402 may be based on the $K_{VCO}$ contribution from variable capacitor 510, the $K_{VCO}$ contribution from variable capacitor 512, and a gain factor of the BW adjustment circuit 520 (e.g., due to gain of the amplification stage with amplifier 522).

In certain aspects, the resistance of resistor $R_L$ may be selected based on the capacitance of capacitor $C_L$ such that the BW of the resulting RC filter ($R_L$ and $C_L$) is much smaller than (e.g., less than one twentieth of) the nominal loop BW, per the following equation:

$$\frac{1}{R_L C_L}$$

In certain aspects, the resistance of resistor $R_L$ may also be selected such that current flow (e.g., charging current to capacitor $C_L$) through the resistor $R_L$ compensates for any leakage current from variable capacitor 512 in order for the voltage across capacitor $C_L$ to remain constant. Therefore, by opening switch $SW_T$ as shown in FIG. 5B, variable capacitor 512 no longer contributes to the VCO 402 gain and, thus, the VCO gain may be based only on the $K_{VCO}$ contribution from variable capacitor 510. Accordingly, the loop BW of the PLL may be effectively reduced.

To recap, both switches $SW_Z$ and $SW_T$ may be closed, and switch $SW_G$ may be open, as illustrated in FIG. 5A, to attain higher loop BW during an initial fast locking period such that the PLL may more quickly obtain a phase/frequency lock. After the initial locking period, switch $SW_G$ may be closed, while switches $SW_Z$ and $SW_T$ may be opened, as depicted in FIG. 5B, to effectively operate the PLL loop with the nominal loop BW. In certain aspects, the loop BW may be temporarily increased as described herein (e.g., by returning to the switching state shown in FIG. 5A) whenever the PLL loses frequency lock (e.g., due to a change in the PLL reference voltage) by a certain threshold.

Certain aspects of the present disclosure reduce the phase glitch during bandwidth switching to negligible levels as described above. Furthermore, using the circuit configurations of FIGS. 5A and 5B may reduce analog switching activity during bandwidth switching, compared to conventional bandwidth switching designs. Moreover, in certain aspects, charge pump mismatch may not be an issue. Aspects of the present disclosure may be implemented as part of a fractional-N PLL. In this case, the resistor $R_G$ in parallel with switch $SW_G$ allows for reduction in the systematic phase glitch due to delta-sigma modulator (DSM) activity of the fractional-N PLL, as described above.

Certain aspects of the present disclosure may also reduce phase noise. That is, the $K_{VCO}$ seen by the charge pump 501 and the loop filter 503 during the lower bandwidth mode is significantly less than the $K_{VCO}$ during the higher bandwidth mode. Moreover, the amplifier 522 and the additional RC network (e.g., $R_G$ in series with $C_L$) may be physically located near the VCO 509.

Certain aspects of the present disclosure accomplish BW switching with reduced area consumption. That is, certain aspects do not use a relatively high charge pump current as a means to support the higher bandwidth mode. Thus, an additional phase-frequency detector (PFD) and charge pump may not be incorporated. In addition, the BW adjustment circuit 520 used to control the variable capacitor 512 may be bypassed once phase/frequency locking has been achieved. Moreover, during nominal operation, $K_{VCO}$ is sufficiently large to track slow frequency drift.

While the example circuit configurations of FIGS. 5A and 5B illustrate single-ended circuits in a PLL loop to facilitate understanding, persons having ordinary skill in the art will appreciate that the techniques described herein can be applied to a differential circuits in the PLL loop (e.g., as described with respect to FIG. 4) having a positive and a negative branch. For example, for a single-ended PLL, the reference potentials 540A-F may be direct current (DC) reference potentials, while for a differential PLL, the reference potentials 540A-F may be alternating current (AC) reference potentials.

Figure 6:
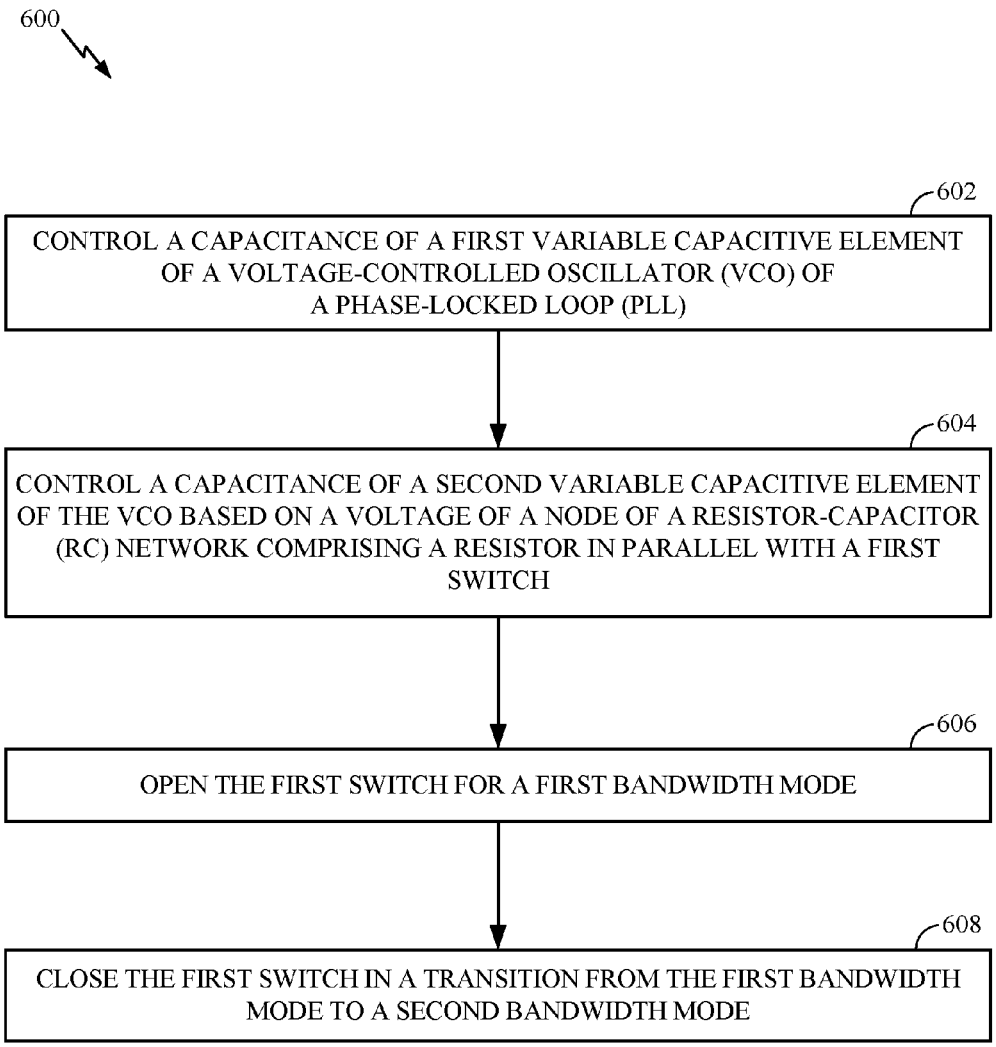
FIG. 6 is a flow diagram of example operations for adjusting a bandwidth of a PLL, in accordance with certain aspects of the present disclosure.

FIG. 6 is a flow diagram of example operations 600 for adjusting a bandwidth (BW) of a phase-locked loop (PLL), in accordance with certain aspects of the present disclosure. The operations 600 may be performed by an apparatus having a PLL (e.g., PLL 400).

The operations 600 may begin, at block 602, with the apparatus controlling a capacitance of a first variable capacitive element (e.g., capacitor 510) of a voltage-controlled oscillator (VCO) (e.g., VCO 402) of the PLL. At block 604, the apparatus controls a capacitance of a second variable capacitive element (e.g., capacitor 512) of the VCO based on a voltage (e.g., Vtune_F) of a node of a resistor-capacitor (RC) network comprising a resistor (e.g., resistor $R_G$) in parallel with a first switch (e.g., switch $SW_G$). At block 606, the apparatus opens the first switch for a first (e.g., higher) bandwidth mode, and at block 608, the apparatus closes the first switch in a transition from the first bandwidth mode to a second (e.g., lower) bandwidth mode.

According to certain aspects, the voltage of the node is based at least in part on a voltage at the resistor of the RC network when the first switch is open and on a voltage at a capacitor (e.g., capacitor $C_L$) of the RC network when the switch is closed.

According to certain aspects, the operations 600 further include the apparatus altering a resistance in series with the RC network by controlling a second switch (e.g., switch $SW_T$) in parallel with a resistor (e.g., resistor $R_L$) in series with the RC network. In this case, the resistance in series is higher when the second switch is open than when the second switch is closed. For certain aspects, controlling the second switch involves opening the second switch before closing the first switch, such that the resistor in series prevents the voltage of the node of the RC network from changing substantially in the transition from the first bandwidth mode to the second bandwidth mode.

According to certain aspects, the operations 600 further involve amplifying or buffering an output of a charge pump in the PLL with an amplification stage (e.g., the non-inverting amplifier), wherein a gain associated with the second variable capacitive element is based on a gain of the amplification stage. For certain aspects, the operations 600 may further entail controlling a resistance of one or more resistors in the amplification stage to set the gain of the amplification stage (and hence, control the gain of the second variable capacitive element).

According to certain aspects, a gain associated with the first variable capacitive element is less than a gain associated with the second variable capacitive element.

According to certain aspects, the operations 600 further involve adjusting a resistance of a loop filter (e.g., loop filter 503) in the PLL between the first bandwidth mode and the second bandwidth mode. For certain aspects, the loop filter includes a first resistor (e.g., resistor $R_{ZF}$), a capacitor (e.g., capacitor $C_Z$), a second resistor (e.g., resistor $R_Z$), and a second switch (e.g., switch $SW_Z$). The second resistor may be connected in series with a second switch, the first resistor may be connected in series with the capacitor, and the second resistor and the second switch may be connected in parallel with the first resistor. In this case, adjusting the resistance of the loop filter may include closing the second switch for the first bandwidth mode and opening the second switch in the second bandwidth mode.

In certain aspects, closing the first switch at block 608 is performed after the PLL is frequency locked.

According to certain aspects, the operations 600 further involve operating a charge pump (e.g., charge pump 406 or 501) in the PLL. In this case, controlling the capacitance of the first variable capacitive element at block 602 may be based on an output of the charge pump.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

For example, means for transmitting may comprise a transmitter (e.g., the transceiver front end 254 of the user terminal 120 depicted in FIG. 2, the transceiver front end 222 of the access point 110 shown in FIG. 2, or the transceiver front end 300 illustrated in FIG. 3) and/or an antenna (e.g., the antennas 252ma through 252mu of the user terminal 120m portrayed in FIG. 2, the antennas 224a through 224ap of the access point 110 illustrated in FIG. 2, or the antenna 303 of the transceiver front end 300 depicted in FIG. 3). Means for receiving may comprise a receiver (e.g., the transceiver front end 254 of the user terminal 120 depicted in FIG. 2, the transceiver front end 222 of the access point 110 shown in FIG. 2, or the transceiver front end 300 illustrated in FIG. 3) and/or an antenna (e.g., the antennas 252ma through 252mu of the user terminal 120m portrayed in FIG. 2, the antennas 224a through 224ap of the access point 110 illustrated in FIG. 2, or the antenna 303 of the transceiver front end 300 depicted in FIG. 3). Means for processing, means for determining, means for operating, means for controlling (a resistance or a capacitance), means for adjusting a resistance, means for opening, and/or means for closing may comprise a processing system, which may include one or more processors (e.g., the TX data processor 210, the RX data processor 242, and/or the controller 230 of the access point 110 shown in FIG. 2, or the RX data processor 270, the TX data processor 288, and/or the controller 280 of the user terminal 120 illustrated in FIG. 2). Means for generating an oscillating signal may comprise a voltage-controlled oscillator (e.g., the VCO 402 shown in FIG. 4 or the VCO 509 illustrated in FIGS. 5A and 5B). Means for charging and discharging one or more capacitors (based on a feedback loop of a PLL) may comprise a charge pump (e.g., the charge pump 406 depicted in FIG. 4 or the charge pump 501 illustrated in FIGS. 5A and 5B). Means for adjusting a bandwidth may comprise a circuit, such as the BW adjustment circuit 520 of FIGS. 5A and 5B. Means for amplifying or buffering may comprise an amplification stage (e.g., the non-inverting amplification stage including amplifier 522 and resistors 524, 526 of FIGS. 5A and 5B). Means for switching and/or means for adjusting a resistance may comprise a switch (e.g., switch $SW_G$, $SW_T$, or $SW_Z$ illustrated in FIGS. 5A and 5B) and/or a processing system (as described above) for controlling the switch.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present disclosure may be implemented or performed with a general purpose processor, a digital signal processor (DSP), an ASIC, a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the physical (PHY) layer. In the case of a user terminal, a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC with the processor, the bus interface, the user interface in the case of an access terminal), supporting circuitry, and at least a portion of the machine-readable media integrated into a single chip, or with one or more FPGAs, PLDs, controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A phase-locked loop (PLL), comprising:
   a voltage-controlled oscillator (VCO) comprising a first variable capacitive element and a second variable capacitive element; and
   a bandwidth (BW) adjustment circuit comprising a first switch in parallel with a resistor of a resistor-capacitor (RC) network, wherein the BW adjustment circuit is configured to:
   open the first switch for a first bandwidth mode;
   close the first switch in a transition from the first bandwidth mode to a second bandwidth mode; and
   control a capacitance of the second variable capacitive element based on a voltage of a node of the RC network.

2. The PLL of claim 1, wherein the voltage of the node is based at least in part on a voltage at the resistor of the RC network when the first switch is open and on a voltage at a capacitor of the RC network when the first switch is closed.

3. The PLL of claim 1, wherein the BW adjustment circuit further comprises:
   a resistor in series with the RC network; and
   a second switch in parallel with the resistor in series, wherein a resistance in series with the RC network is higher when the second switch is open than when the second switch is closed.

4. The PLL of claim 3, wherein:
   the resistor in series is configured to prevent the voltage of the node of the RC network from changing substantially in the transition from the first bandwidth mode to the second bandwidth mode; and
   the first bandwidth mode has a higher bandwidth than the second bandwidth mode.

5. The PLL of claim 1, wherein:
   the BW adjustment circuit further comprises an amplification stage; and
   a gain associated with the second variable capacitive element is based on a gain of the amplification stage.

6. The PLL of claim 5, further comprising a charge pump, wherein:
   a capacitance of the first variable capacitive element is controlled based on an output of the charge pump; and
   the amplification stage is coupled between the output of the charge pump and the RC network.

7. The PLL of claim 6, wherein:
   the amplification stage comprises an amplifier, a first resistor, and a second resistor;
   the output of the charge pump is coupled to a first input of the amplifier;
   a second input of the amplifier is coupled to a node between the first resistor and the second resistor;
   the first resistor is coupled to an output of the amplifier;
   the second resistor is coupled to a reference potential; and
   the gain of the amplification stage is set by controlling a resistance of at least one of the first resistor or the second resistor.

8. The PLL of claim 1, wherein a gain associated with the first variable capacitive element is less than a gain associated with the second variable capacitive element.

9. The PLL of claim 1, further comprising a loop filter, wherein a resistance of the loop filter is changed between the first bandwidth mode and the second bandwidth mode.

10. The PLL of claim 9, wherein:
    the loop filter comprises a first resistor, a capacitor, and a second resistor in series with a second switch;
    the first resistor is connected in series with the capacitor;
    the second resistor and the second switch are connected in parallel with the first resistor; and
    the second switch is closed for the first bandwidth mode and opened for the second bandwidth mode.

11. The PLL of claim 1, wherein the BW adjustment circuit is configured to transition from the first bandwidth mode to the second bandwidth mode after the PLL is frequency locked.

12. The PLL of claim 1, wherein the first variable capacitive element is connected in parallel with the second variable capacitive element.

13. A method for adjusting a bandwidth of a phase-locked loop (PLL), comprising:
    controlling a capacitance of a first variable capacitive element of a voltage-controlled oscillator (VCO) of the PLL;
    controlling a capacitance of a second variable capacitive element of the VCO based on a voltage of a node of a resistor-capacitor (RC) network comprising a resistor in parallel with a first switch;
    opening the first switch for a first bandwidth mode; and
    closing the first switch in a transition from the first bandwidth mode to a second bandwidth mode.

14. The method of claim 13, wherein the voltage of the node is based at least in part on a voltage at the resistor of the RC network when the first switch is open and on a voltage at a capacitor of the RC network when the first switch is closed.

15. The method of claim 13, further comprising altering a resistance in series with the RC network by controlling a second switch in parallel with a resistor in series with the RC network, wherein the resistance in series is higher when the second switch is open than when the second switch is closed.

16. The method of claim 15, wherein:
controlling the second switch comprises opening the second switch before closing the first switch, such that the resistor in series prevents the voltage of the node of the RC network from changing substantially in the transition from the first bandwidth mode to the second bandwidth mode; and
the first bandwidth mode has a higher bandwidth than the second bandwidth mode.

17. The method of claim 13, further comprising amplifying or buffering an output of a charge pump in the PLL with an amplification stage, wherein a gain associated with the second variable capacitive element is based on a gain of the amplification stage.

18. The method of claim 17, further comprising controlling a resistance of one or more resistors in the amplification stage to set the gain of the amplification stage.

19. The method of claim 13, wherein a gain associated with the first variable capacitive element is less than a gain associated with the second variable capacitive element.

20. The method of claim 13, further comprising adjusting a resistance of a loop filter in the PLL between the first bandwidth mode and the second bandwidth mode.

21. The method of claim 20, wherein:
the loop filter comprises a first resistor, a capacitor, and a second resistor in series with a second switch;
the first resistor is connected in series with the capacitor;
the second resistor and the second switch are connected in parallel with the first resistor; and
adjusting the resistance of the loop filter comprises closing the second switch for the first bandwidth mode and opening the second switch in the second bandwidth mode.

22. The method of claim 13, wherein closing the first switch is performed after the PLL is frequency locked.

23. The method of claim 13, further comprising operating a charge pump in the PLL, wherein controlling the capacitance of the first variable capacitive element is based on an output of the charge pump.

24. An apparatus for adjusting a bandwidth (BW) of a feedback loop for a phase-locked loop (PLL), comprising:
means for generating an oscillating signal comprising a first variable capacitor and a second variable capacitor;
means for charging and discharging one or more capacitors based on the feedback loop to generate a first control signal, wherein the first control signal is configured to control a capacitance of the first variable capacitor; and
means for adjusting the BW of the feedback loop by generating a second control signal to control a capacitance of the second variable capacitor, wherein the means for adjusting the BW is configured to:
change a resistance of a resistor-capacitor (RC) network configured to process the second control signal; and
alter a series resistance between the RC network and an output of the means for charging and discharging the one or more capacitors.

25. The apparatus of claim 24, wherein the means for adjusting the BW is configured to change the resistance of the RC network by closing a means for switching in parallel with a resistor of the RC network to decrease the resistance of the RC network.

26. The apparatus of claim 24, wherein the means for adjusting the BW is configured to alter the series resistance by opening a means for switching in parallel with a resistor coupled between the RC network and the output of the means for charging and discharging the one or more capacitors to increase the series resistance.

27. The apparatus of claim 24, wherein the means for adjusting the BW of the feedback loop comprises means for amplifying or buffering the second control signal, wherein a gain associated with the second variable capacitor is based on a gain of the means for amplifying or buffering.

28. The apparatus of claim 27, wherein:
the means for amplifying or buffering is coupled between the output of the means for charging and discharging the one or more capacitors and the RC network;
the output of the means for charging and discharging the one or more capacitors is coupled to a first input of the means for amplifying or buffering; and
a second input of the means for amplifying or buffering is coupled to a node between a first resistor coupled to an output of the means for amplifying or buffering and a second resistor coupled to a reference potential.

29. The apparatus of claim 28, further comprising means for controlling a resistance of at least one of the first resistor or the second resistor to set the gain of the means for amplifying or buffering.

30. The apparatus of claim 24, further comprising means for adjusting a resistance of an RC filter of a loop filter coupled between the means for charging and discharging the one or more capacitors and the means for generating the oscillating signal, to further adjust the BW of the feedback loop.

* * * * *